(12) United States Patent
He

(10) Patent No.: US 10,622,387 B2
(45) Date of Patent: Apr. 14, 2020

(54) METHOD FOR MANUFACTURING ACTIVE ARRAY SWITCH

(71) Applicant: HKC CORPORATION LIMITED, Guangdong (CN)

(72) Inventor: Huailiang He, Guangdong (CN)

(73) Assignee: HKC CORPORATION, LTD., Shenzhen, Guangdong (CN)

( * ) Notice: Subject to any disclaimer, the term of this patent is extended or adjusted under 35 U.S.C. 154(b) by 290 days.

(21) Appl. No.: 15/739,345

(22) PCT Filed: Sep. 22, 2017

(86) PCT No.: PCT/CN2017/102869
§ 371 (c)(1),
(2) Date: Dec. 22, 2017

(87) PCT Pub. No.: WO2019/051864
PCT Pub. Date: Mar. 21, 2019

(65) Prior Publication Data
US 2020/0043961 A1    Feb. 6, 2020

(30) Foreign Application Priority Data

Sep. 15, 2017  (CN) .......................... 2017 1 0833624

(51) Int. Cl.
*H01L 21/00*   (2006.01)
*H01L 27/12*   (2006.01)
(Continued)

(52) U.S. Cl.
CPC ........ *H01L 27/1288* (2013.01); *H01L 27/127* (2013.01); *H01L 27/1222* (2013.01);
(Continued)

(58) Field of Classification Search
CPC ......... H01L 21/00; H01L 21/84; H01L 21/28; H01L 21/44; H01L 21/16; H01L 21/4763;
(Continued)

(56) References Cited

U.S. PATENT DOCUMENTS 6,107,640 A * 8/2000 Park ................. H01L 29/78618
257/59
9,543,330 B1 1/2017 Wu et al.
(Continued)

FOREIGN PATENT DOCUMENTS

| CN | 1677626 A | 10/2005 |
|---|---|---|
| CN | 103383989 A | 11/2013 |
| CN | 105990449 A | 10/2016 |

OTHER PUBLICATIONS

International Search Report dated Jun. 15, 2018, in the corresponding PCT application PCT/CN2017/102869, 11 pages in Chinese.

*Primary Examiner* — Chuong A Luu
(74) *Attorney, Agent, or Firm* — Juan Carlos A. Marquez; Marquez IP Law Office, PLLC

(57) ABSTRACT

This application provides a method for manufacturing an active array switch, including: forming a gate pattern, gate insulation layer and a semiconductor layer on a substrate; forming a photoresist layer on the semiconductor layer, and removing a part of the semiconductor layer, to form a semiconductor pattern; performing a dry etching process on the photoresist layer, so that only the part of the photoresist layer above the middle part of the gate pattern still covers a part of the semiconductor pattern; changing the part of the semiconductor pattern uncovered by the photoresist layer into a conductor layer by means of a conductor process; and removing the entire photoresist layer above the gate pattern and forming a source and a drain.

20 Claims, 12 Drawing Sheets

(51) Int. Cl.
*H01L 29/786* (2006.01)
*H01L 29/423* (2006.01)

(52) U.S. Cl.
CPC .... *H01L 27/1262* (2013.01); *H01L 29/42384* (2013.01); *H01L 29/78693* (2013.01)

(58) Field of Classification Search
CPC ..... H01L 27/12; H01L 27/15; H01L 27/1225; H01L 27/1222; H01L 27/1288; H01L 27/127; H01L 27/1262; H01L 29/04; H01L 29/78; H01L 29/786; H01L 29/7869; H01L 29/78693; H01L 29/42384
See application file for complete search history.

(56) References Cited

U.S. PATENT DOCUMENTS

| | | | | |
|---|---|---|---|---|
| 2003/0134458 | A1* | 7/2003 | Shih | H01L 27/1214 438/149 |
| 2009/0166616 | A1* | 7/2009 | Uchiyama | H01L 29/7869 257/43 |
| 2011/0003418 | A1* | 1/2011 | Sakata | H01L 29/24 438/34 |
| 2011/0117707 | A1* | 5/2011 | Lin | H01L 27/1288 438/158 |

\* cited by examiner

METHOD FOR MANUFACTURING ACTIVE ARRAY SWITCH

BACKGROUND

Technical Field

This application relates to a method for manufacturing an active array switch, and in particular, to a method for manufacturing an active array switch by using which on-current is maintained by changing a semiconductor layer into a conductor layer.

Related Art

Currently, a semiconductor layer in an active array switch driving a display panel mainly includes an amorphous silicon (a-Si) semiconductor layer, an oxide semiconductor layer, a polycrystalline silicon (Poly-Si) semiconductor layer, and the like. Compared with an a-Si semiconductor, an oxide semiconductor has higher mobility and a lower electric leakage rate. Although having higher mobility, a Poly-Si active array switch is not applicable to the current production line of a mainstream product as a result of relatively high costs.

A commonly used structure of an active array switch with an oxide semiconductor includes an etch stop layer (ESL) structure, a back channel etch (BCE) structure, a co-planner self-align top gate structure, a dual gate structure, and the like. It is relatively hard to process a co-planner self-align top gate active array switch, and a dual gate active array switch has a relatively large parasitic capacitance. Therefore, in flat-panel application of active array switches, ESL structures and BCE are relatively common. The BCE structures, with an advantage that a photomask is not needed, are a development focus in the future.

For a BCE structure, to ensure a specific mobility, there are usually overlapping areas (OL) between a gate and a source/drain. Parasitic capacitance is formed in these areas of the gate and the source/drain, causing inconvenience to large-sized and high dynamic range display. Parasitic capacitance can be reduced by removing overlapping areas between a gate and a source/drain (or even by forming an offset). However, this reduces on-current and mobility of TFT.

SUMMARY

An objective of this application is to provide a method for manufacturing an active array switch, and in particular, to provide a method for manufacturing an active array switch by using which on-current is maintained by changing a semiconductor layer into a conductor layer.

In recent years, due to the progress of the semiconductor process technologies, manufacturing of active array switches is increasingly easier and faster. Active array switches are widely applied to electronic products such as computer chip, mobile phone chip, and active array switch liquid crystal display (thin film transistor liquid crystal display, TFT LCD). Using an active array switch liquid crystal display as an example, the active array switch is used for charging or discharging a storage capacitor.

Generally, active array switches may be categorized as amorphous silicon (Amorphous Silicon Transistor) active array switches and polycrystalline silicon (Low Temperature Polycrystalline Transistor) active array switches according to the materials of semiconductor layers. However, to cater to the increase of demand on liquid crystal displays in the market, more have been invested into research and development of new active array switch technologies. Using a BCE structure as an example, to ensure specific mobility, there are usually overlapping areas between a gate and a source/drain. Parasitic capacitance is formed in these areas of the gate and the source/drain, causing inconvenience to large-sized and high dynamic range display. Parasitic capacitance can be reduced by removing overlapping areas between a gate and a source/drain (or even by forming an offset). However, this reduces TFT on-current and mobility.

Therefore, this application provides a method for manufacturing an active array switch, comprising the following steps: forming a first metal layer on a substrate, and patterning the first metal layer, to form a gate pattern; forming a gate insulation layer on the substrate, to cover the gate pattern; forming a semiconductor layer on the gate insulation layer; forming a photoresist layer having a plurality of thicknesses on the semiconductor layer, where a thickness of the photoresist layer above the middle part of the gate pattern is greater than a thicknesses of the photoresist layer above the two sides of the gate pattern; removing a part of the semiconductor layer, to form a semiconductor pattern; performing a dry etching process on the photoresist layer, to remove the thicknesses of the photoresist layer above the two sides of the gate pattern and make the thickness, of the photoresist layer, left after the dry etching and above the middle part of the gate pattern still cover a part of the semiconductor pattern; changing the part of the semiconductor pattern uncovered by the photoresist layer into a conductor layer by means of a conductor process; removing the entire photoresist layer above the gate pattern; and forming a second metal layer on the semiconductor pattern, the conductor layer and the gate insulation layer, and patterning the second metal layer, to form a source and a drain.

In an embodiment of this application, the step of forming the photoresist layer having a plurality of thicknesses comprises: forming a photosensitive material layer on the semiconductor layer, performing an exposure process on the photosensitive material layer by using a half-tone photomask, and performing a development process.

In an embodiment of this application, the step of forming the photoresist layer having a plurality of thicknesses comprises: forming a photosensitive material layer on the semiconductor layer, performing an exposure process on the photosensitive material layer by using a gray-tone photomask, and performing a development process.

In an embodiment of this application, the semiconductor layer is a metal oxide semiconductor layer, where metal of the metal oxide semiconductor layer comprises elements from group II to group VI and groups comprising compounds of these elements.

In an embodiment of this application, the metal semiconductor layer is further doped with one or more elements selected from alkaline-earth metal, group IIIA, group VA, group VIA or a group comprising transition metal.

In an embodiment of this application, a passivation layer is formed on the source, the drain, the semiconductor pattern, and the gate insulation layer.

In an embodiment of this application, an insulation material layer is formed between the semiconductor layer and the photoresist layer.

In the foregoing embodiment of this application, the insulation material layer is an organic insulation material layer (such as a silicon oxide layer or a silicon nitride layer), or may be an inorganic insulation material layer (such as a polymethyl methacrylate layer or a polyvinyl phenol layer).

Further, the objective of this application may be achieved and the technical problem of this application may be resolved by using the following technical solutions. This application provides a method for manufacturing an active array switch, comprising: forming a first metal layer on a substrate, and patterning the first metal layer, to form a gate pattern; forming a gate insulation layer on the substrate, to cover the gate pattern; forming a semiconductor layer on the gate insulation layer, forming an insulation material layer on the semiconductor layer, forming a photosensitive material layer on the insulation material layer, performing an exposure process on the photosensitive material layer by using a photomask; performing a development process on the photosensitive material layer, to form a photoresist layer having a plurality of thicknesses where a thickness of the photoresist layer above the middle part of the gate pattern is greater than a thicknesses of the photoresist layer above the two sides of the gate pattern; removing a part of the semiconductor layer, to form a semiconductor pattern; performing a dry etching process on the photoresist layer, to remove the thicknesses of the photoresist layer above the two sides of the gate pattern and leave the part of the first photoresist layer above the middle part of the gate pattern to cover a part of the semiconductor pattern; changing the part of the semiconductor pattern uncovered by the photoresist layer into a conductor layer by means of a conductor process; removing the entire photoresist layer above the gate pattern; forming a second metal layer on the semiconductor pattern, the conductor layer and the gate insulation layer, and patterning the second metal layer, to form a source and a drain; and forming a passivation layer on the source, the drain, the semiconductor pattern, and the gate insulation layer.

Due to the improvement in this application, in a BCE-structured active array switch with a semiconductor, there is no overlapping area between a gate and a source/between a gate and a drain. During a process, a semiconductor layer is changed into a conductor layer by means of a conductor process, to reduce impedance between a source/drain and a TFT channel. In this way, parasitic capacitance in the active array switch is greatly reduced while on-current is ensured.

DETAILED DESCRIPTION

The following embodiments are described with reference to the accompanying drawings, which are used to exemplify specific embodiments for implementation of this application. Terms about directions mentioned in this application, such as "on", "below", "front", "back", "left", "right", "in", "out", and "side surface" merely refer to directions in the accompanying drawings. Therefore, the used terms about directions are used to describe and understand this application, and are not intended to limit this application.

The accompanying drawings and the description are considered to be essentially exemplary, rather than limitative. In the figures, units with similar structures are represented by using the same reference number. In addition, for understanding and ease of description, the size and the thickness of each component shown in the accompanying drawings are arbitrarily shown, but this application is not limited thereto.

In the accompanying drawings, for clarity, thicknesses of a layer, a film, a panel, an area, and the like are enlarged. In the accompanying drawings, for understanding and ease of description, thicknesses of some layers and areas are enlarged. It should be understood that when a component such as a layer, a film, an area, or a base is described to be "on" "another component", the component may be directly on the another component, or there may be an intermediate component.

In addition, in this specification, unless otherwise explicitly described to have an opposite meaning, the word "include" is understood as including the component, but not excluding any other component. In addition, in this specification, "on" means that a component is located on or below a target component, but does not mean that the component needs to be located on top of the gravity direction.

To further describe the technical measures taken in this application to achieve the intended application objective and effects thereof, specific implementations, structures, features, and effects of a method for manufacturing an active array switch provided according to this application are described below in detail with reference to the drawings and preferred embodiments.

This application provides a method for manufacturing an active array switch by using which a semiconductor layer is changed into a conductor layer to reduce impedance between a source and a drain not form an overlapping area, thereby ensuring on-current while reducing parasitic capacitance in an active array switch. The method for manufacturing an active array switch provided in this application includes the following steps.

Figure 1A:
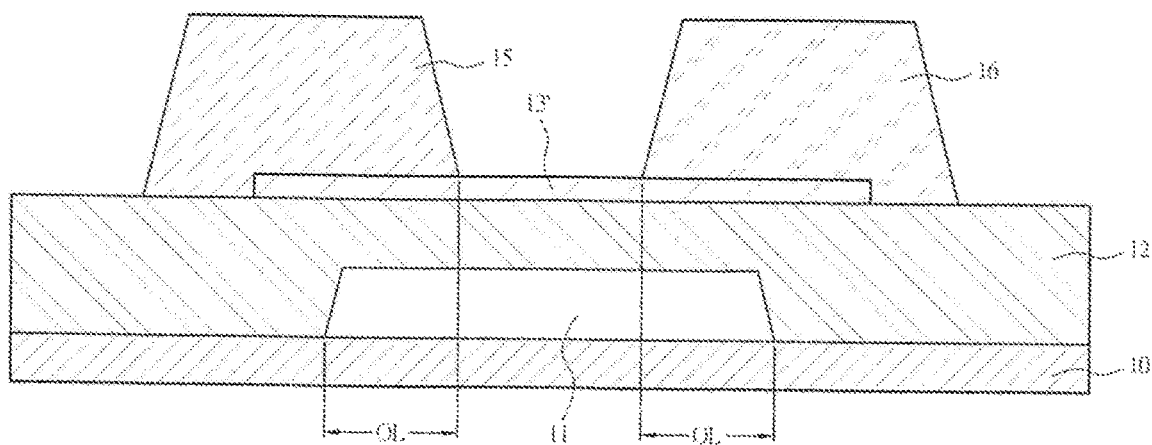
FIG. 1A is a schematic structural diagram showing that there is an overlapping area between a gate and a source and between the gate and a drain.
Figure 1B:
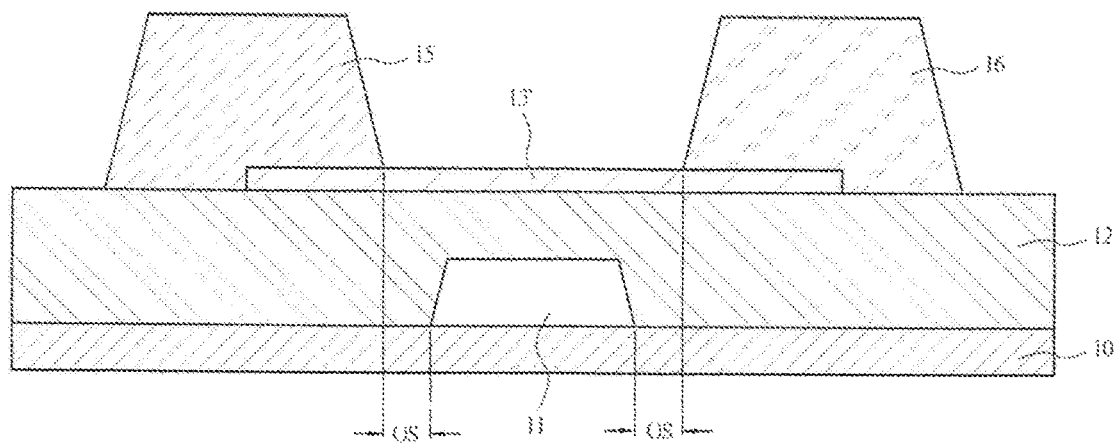
FIG. 1B is a schematic structural diagram showing that there is no overlapping area between a gate and a source or between the gate and a drain.

Referring to FIG. 1A and FIG. 1B, FIG. 1A is a schematic structural diagram showing that there is an overlapping area between a gate and a source and between the gate and a drain, and FIG. 1B is a schematic structural diagram showing that there is no overlapping area between a gate and a source or between the gate and a drain. As shown in FIG. 1A and FIG. 1B, first, a plurality of gate patterns 11 is formed on a substrate 10. Then, a gate insulation layer 12 is formed on the substrate 10, to cover the gate pattern 11. Next, a semiconductor layer 13 is formed on the gate insulation layer 12, and a part of the semiconductor layer 13 is removed, to form a semiconductor pattern 13'. Finally, a source 15 and a drain 16 are formed on the semiconductor pattern 13'.

In FIG. 1A, there is an overlapping area between the gate pattern 11 and the source 15 and between the gate pattern 11 and the drain 16. Parasitic capacitance is formed in the overlapping area, causing inconvenience to large-sized and high dynamic range display. When the overlapping area is removed or even when there is an offset OS, as shown in FIG. 1B, parasitic capacitance can be reduced. However, this manner leads to increase of impedance between the source and the drain, and further, leads to decrease of on-current and mobility of the active array switch.

Therefore, in this application, on the premise that parasitic capacitance is reduced by removing an overlapping area, the semiconductor pattern 13' is changed into a conductor layer, to reduce impedance between a source and a gate. In this way, specific on-current and mobility is maintained for an active array switch when parasitic capacitance is reduced.

Figure 2A:
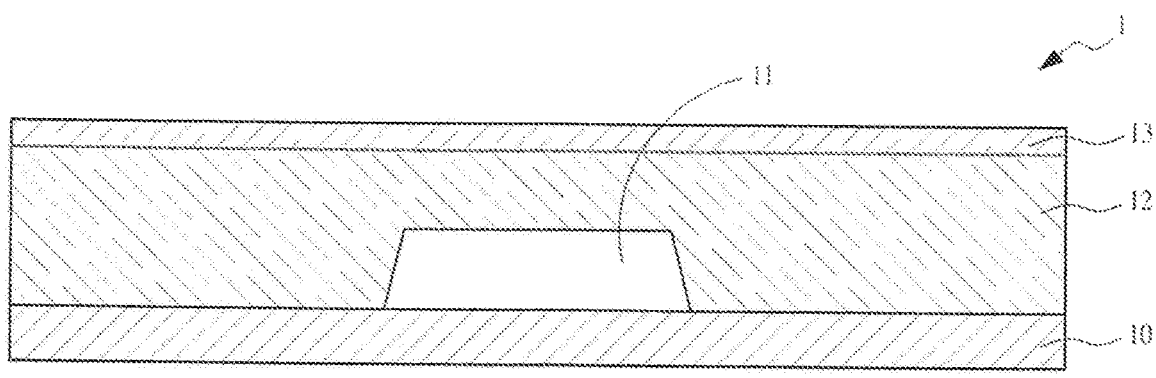
FIG. 2A is a schematic diagram of film forming of a semiconductor according to an embodiment of this application.

Referring to FIG. 2A to FIG. 2G, a method for manufacturing an active array switch 1 provided in this application is first shown in FIG. 2A. A first metal layer is formed on a substrate 10, and the first metal layer is patterned, to form a gate pattern 11. Then, a gate insulation layer 12 is formed on the substrate 10, to cover the gate pattern 11, and then a semiconductor layer 13 is formed on the gate insulation layer 12.

In an embodiment, the semiconductor layer 13 is a metal oxide semiconductor layer, where metal of the metal oxide semiconductor layer includes elements from group II to group VI and groups including compounds of these elements.

In the foregoing embodiment, the metal semiconductor layer is further doped with one or more elements selected from alkaline-earth metal, group IIA, group VA, group VIA or a group including transition metal.

Figure 2B:
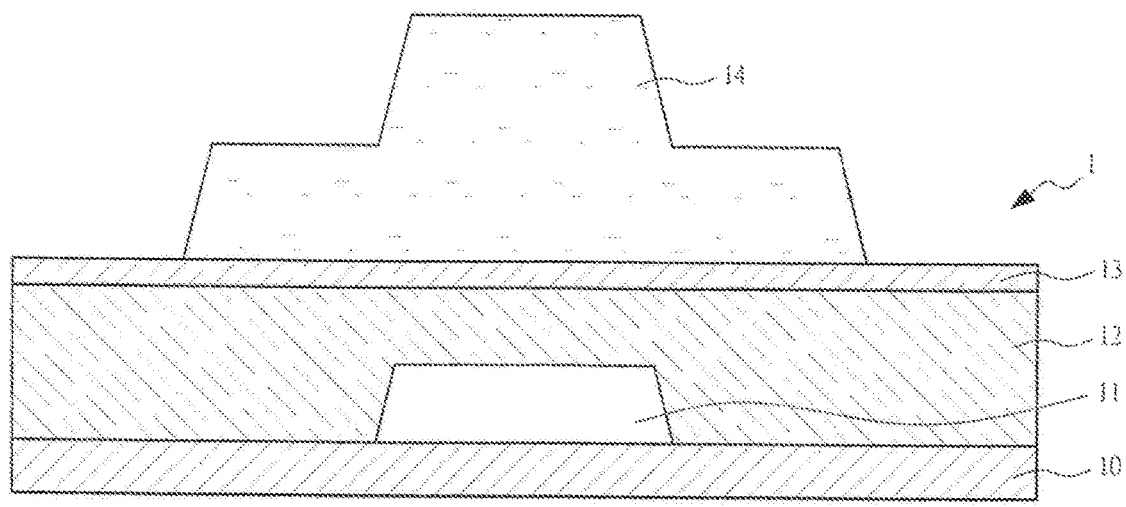
FIG. 2B is a schematic diagram of formation of a photoresist layer according to an embodiment of this application.

Next, as shown in FIG. 2B, a photoresist layer 14 having a plurality of thicknesses is formed on the semiconductor layer 13, where a thickness of the photoresist layer 14 above the middle part of the gate pattern 11 is greater than a thickness of the photoresist layer 14 above the two sides of the gate pattern 11.

In an embodiment, the step of forming the photoresist layer 14 having a plurality of thicknesses includes: forming a photosensitive material layer on the semiconductor layer 13, performing an exposure process on the photosensitive material layer by using a half-tone photomask, and performing a development process.

In an embodiment, the step of forming the photoresist layer 14 having a plurality of thicknesses includes: forming a photosensitive material layer on the semiconductor layer 13, performing an exposure process on the photosensitive material layer by using a gray-tone photomask, and performing a development process.

Figure 2C:
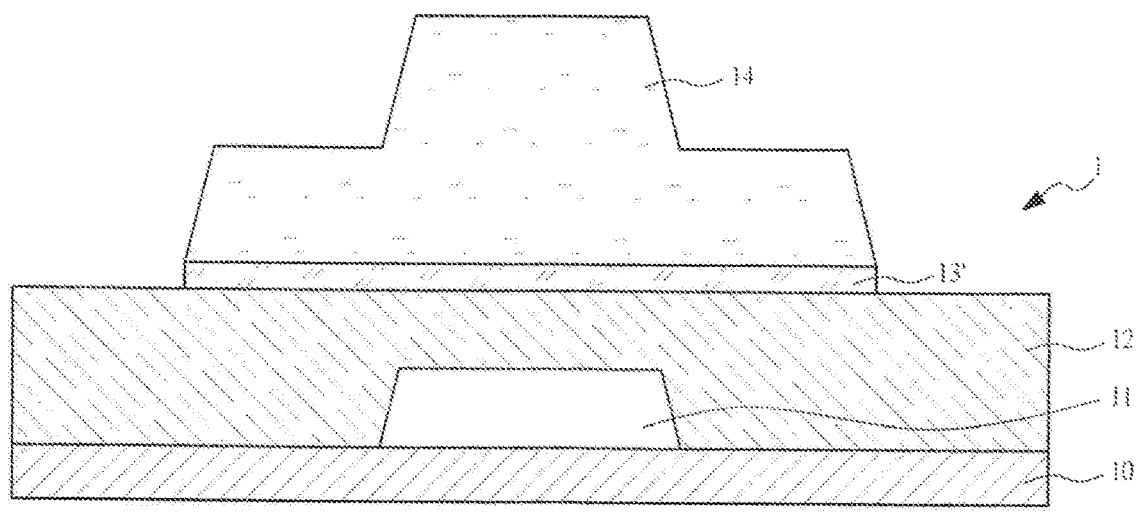
FIG. 2C is a schematic diagram of formation of a semiconductor pattern according to an embodiment of this application.

Next, as shown in FIG. 2C, a part of the semiconductor layer 13 is removed by using the photoresist layer 14 as a mask, to form a semiconductor pattern 13'.

Figure 2D:
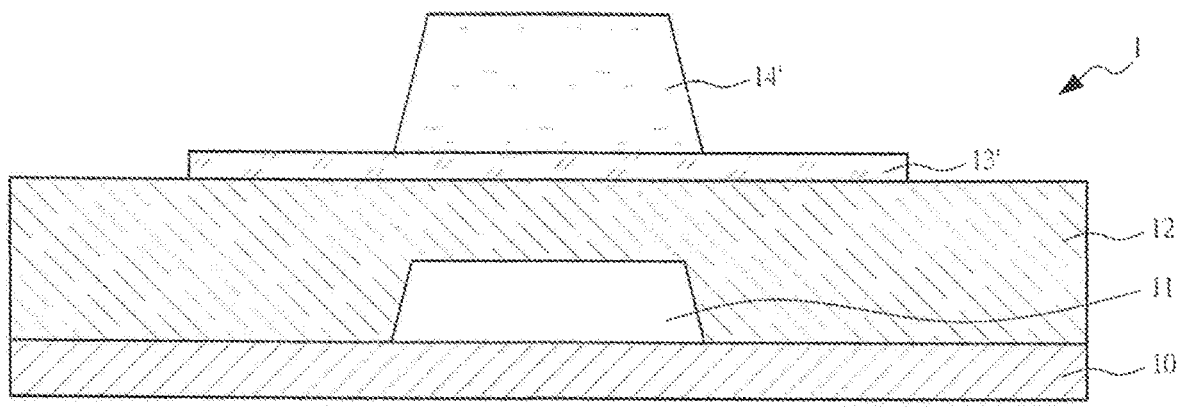
FIG. 2D is a schematic diagram of performing a dry etching process according to an embodiment of this application.

Next, as shown in FIG. 2D, a dry etching process (such as plasma etching) is performed on the photoresist layer 14, to remove the thicknesses of the photoresist layer 14 above the two sides of the gate pattern 11 and make the thickness (the photoresist layer 14'), of the photoresist layer 14, left after the dry etching and above the middle part of the gate pattern 11 still cover a part of the semiconductor pattern 13'.

Figure 2E:
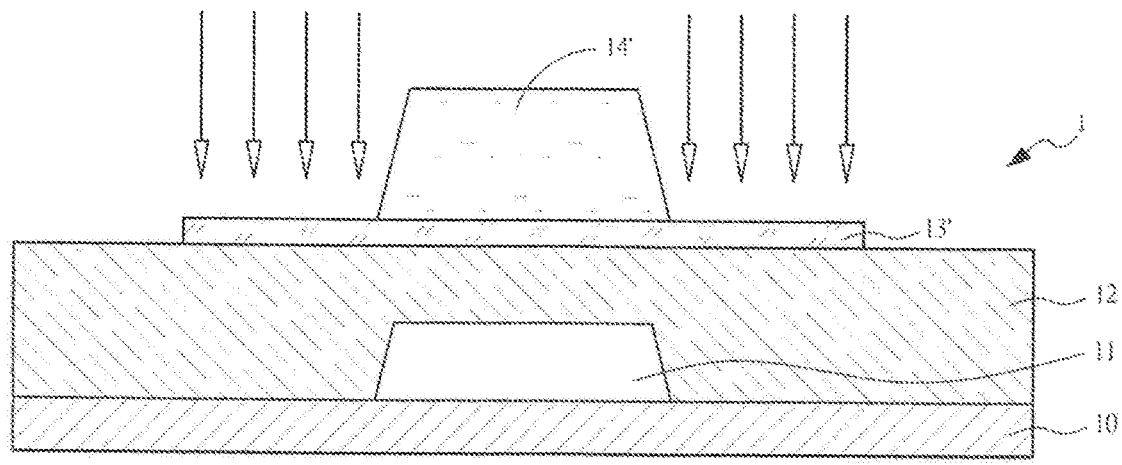
FIG. 2E is a schematic diagram of a conductor process according to an embodiment of this application.

Next, as shown in FIG. 2E, the part of the semiconductor pattern 13' uncovered by the photoresist layer 14' is changed into a conductor layer by means of a conductor process. In this case, the part of the semiconductor pattern 13' uncovered by the photoresist layer 14' is changed into a conductor layer 13A by means of the conductor process. For example, the surface of the semiconductor layer 13 is processed by a gas such as $H_2$, $NH_3$, $CF_4$, $SF_6$, He, Ar, or $N_2$. Alternatively, changing into a conductor is achieved by depositing interlayer dielectric on the surface of the semiconductor layer 13 and the surface of the substrate 10 by means of chemical vapor deposition.

Figure 2F:
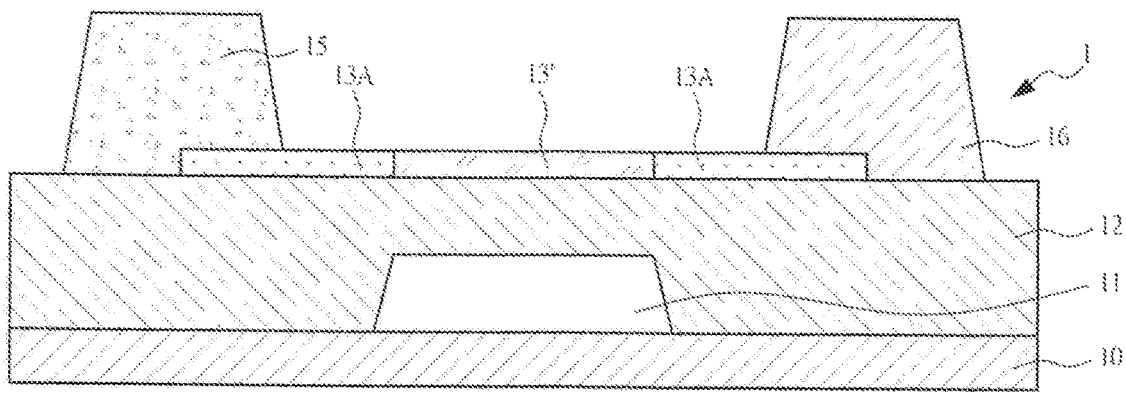
FIG. 2F is a schematic diagram of removing all photoresist layers according to an embodiment of this application.
Figure 2G:
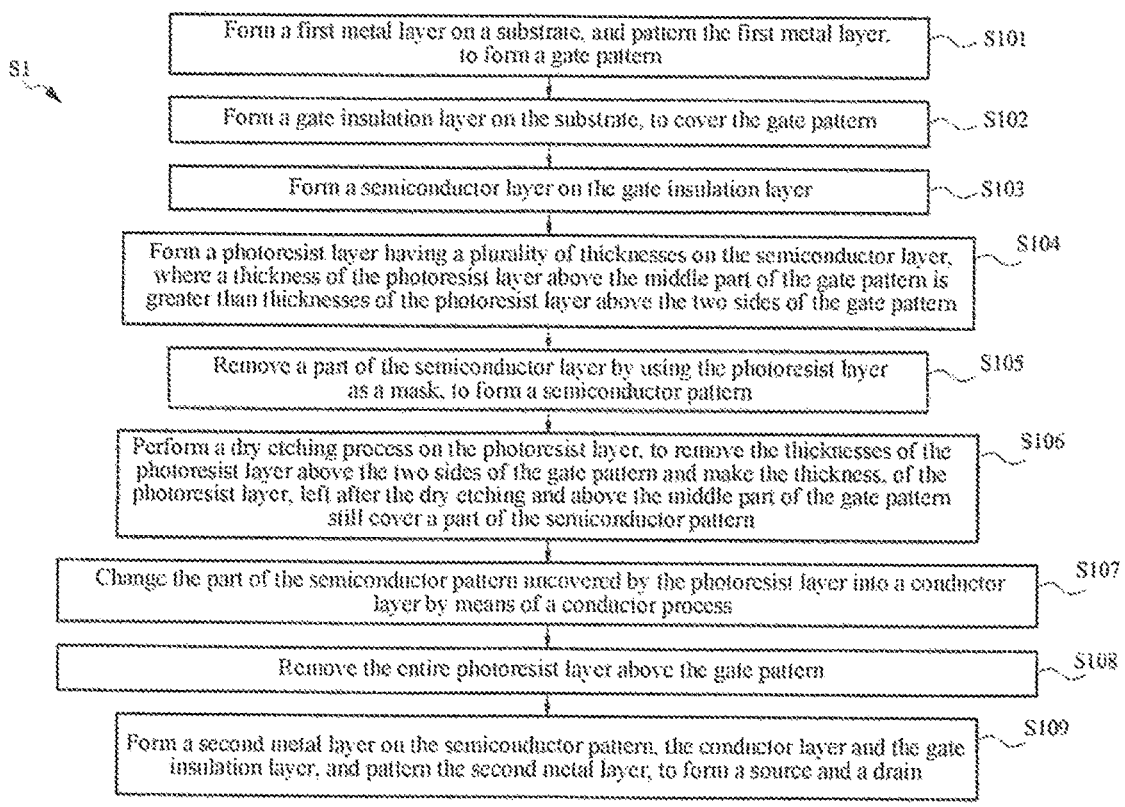
FIG. 2G is a flowchart of a method for manufacturing an active array switch according to an embodiment of this application.

Finally, as shown in FIG. 2F, the entire photoresist layer 14' above the middle part of the gate pattern 11 is removed. A second metal layer is formed on the semiconductor pattern 13', the conductor layer 13A and the gate insulation layer 12, and the second metal layer is patterned, to form a source 15 and a drain 16. In this case, the semiconductor pattern 13' and the conductor layer 13A exist between the source 15 and the drain 16. Due to conductivity of the conductor layer 13A, impedance between the source 15 and the drain 16 is reduced, and specific on-current and mobility are maintained. Based on the above steps, as shown in the flowchart FIG. 2G, the method S1 for manufacturing an active array switch includes the following steps:

Step S101: Form a first metal layer on a substrate, and pattern the first metal layer, to form a gate pattern.

Step S102: Form a gate insulation layer on the substrate, to cover the gate pattern.

Step S103: Form a semiconductor layer on the gate insulation layer.

Step S104: Form a photoresist layer having a plurality of thicknesses on the semiconductor layer, where a thickness of the photoresist layer above the middle part of the gate pattern is greater than a thickness of the photoresist layer above the two sides of the gate pattern.

Step S105: Remove a part of the semiconductor layer by using the photoresist layer as a mask, to form a semiconductor pattern.

Step S106: Perform a dry etching process on the photoresist layer, to remove the thicknesses of the photoresist layer above the two sides of the gate pattern and make the thickness, of the photoresist layer, left after the dry etching and above the middle part of the gate pattern still cover a part of the semiconductor pattern.

Step S107: Change the part of the semiconductor pattern uncovered by the photoresist layer into a conductor layer by means of a conductor process.

Step S108: Remove the entire photoresist layer above the gate pattern.

Step S109: Form a second metal layer on the semiconductor pattern, the conductor layer and the gate insulation layer, and pattern the second metal layer, to form a source and a drain.

Figure 3:
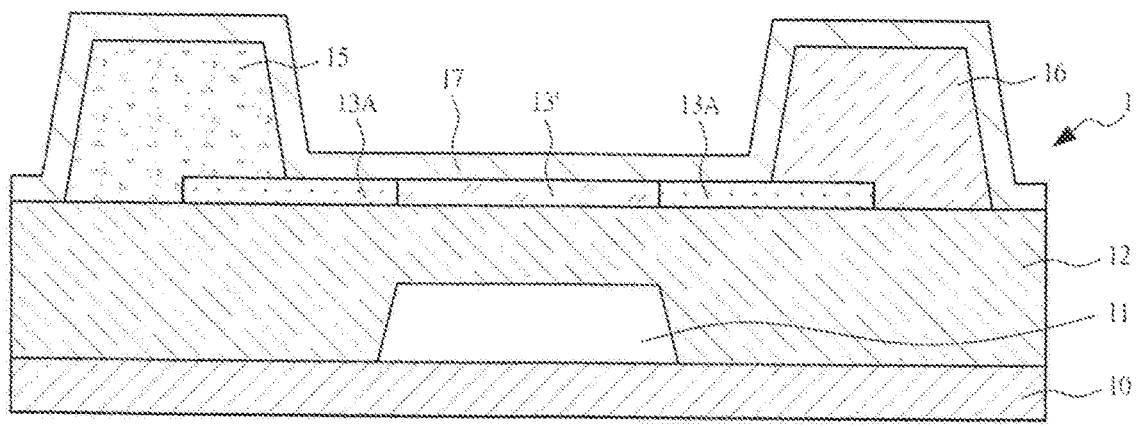
FIG. 3 is a schematic structural diagram of formation of a passivation layer according to another embodiment of this application.

Another embodiment of this application may be shown in FIG. 3. A passivation layer 17 is formed on the source 15, the drain 16, the semiconductor pattern 13', the conductor layer 13A, and the gate insulation layer 12.

Figure 4:
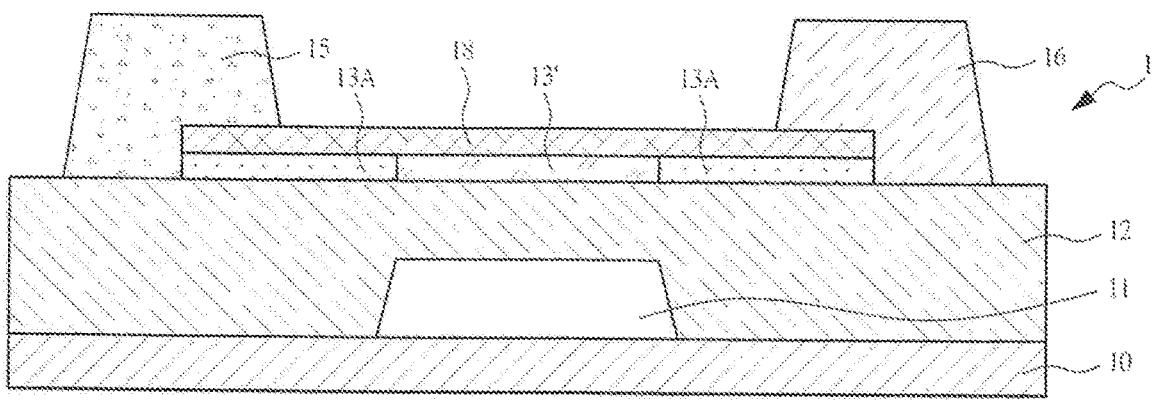
FIG. 4 is a schematic structural diagram of formation of an insulation material layer according to another embodiment of this application.

Another embodiment of this application may be shown in FIG. 4. The semiconductor layer 13' and the conductor layer 13A are covered by an insulation material layer 18. The insulation material layer 18 may be made of an organic insulation material (such as silicon oxide or silicon nitride)

or may be made of an inorganic insulation material (such as polymethyl methacrylate or polyvinyl phenol), to protect the semiconductor pattern 13' and the conductor layer 13A.

Figure 5:
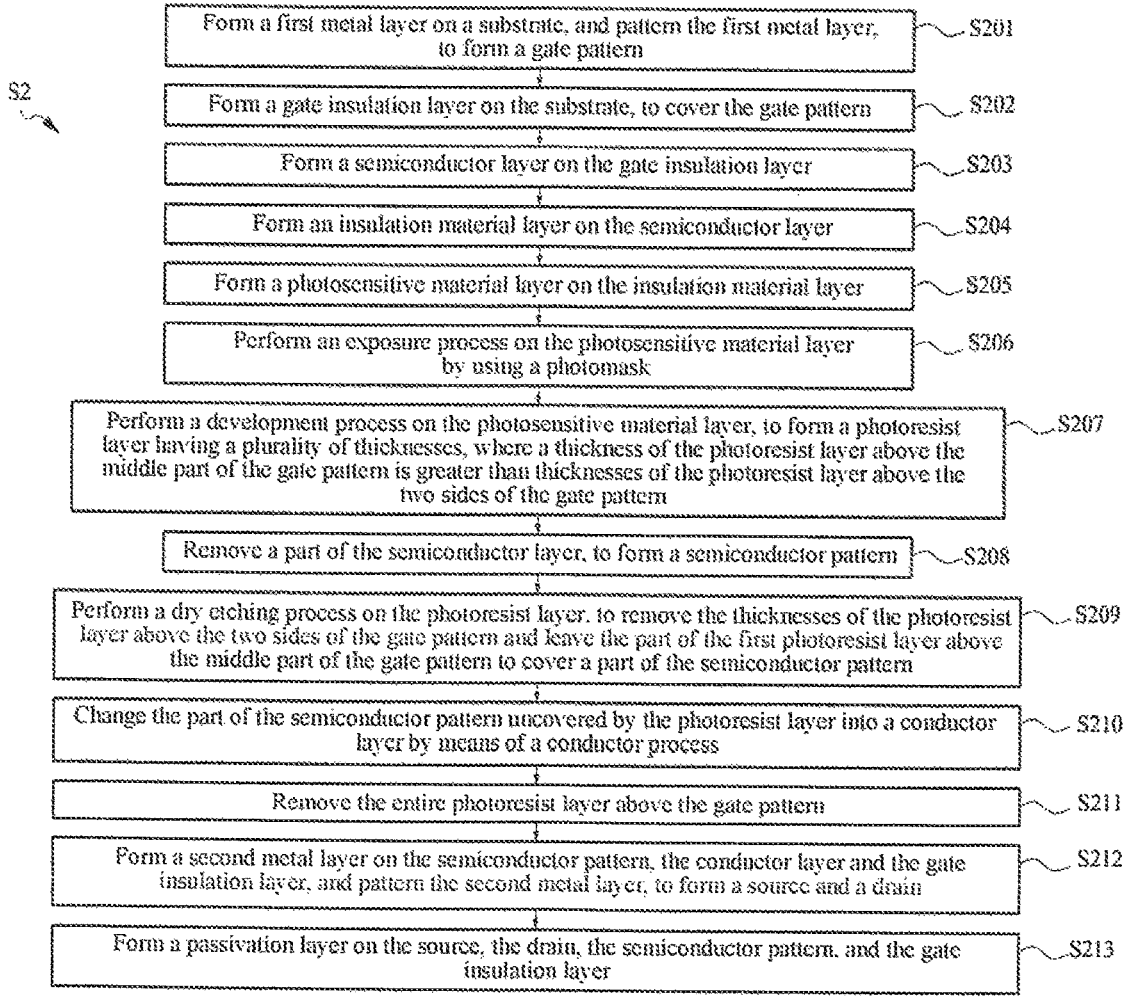
FIG. 5 is a flowchart of a method for manufacturing an active array switch according to another embodiment of this application.

Further, the objective of this application may be achieved and the technical problem of this application may be resolved by using the following technical solutions. This application provides a method S2 for manufacturing an active array switch, as shown in FIG. 5, which includes the following steps:

Step S201: Form a first metal layer on a substrate, and pattern the first metal layer, to form a gate pattern.

Step S202: Form a gate insulation layer on the substrate, to cover the gate pattern.

Step S203: Form a semiconductor layer on the gate insulation layer.

Step S204: Form an insulation material layer on the semiconductor layer.

Step S205: Form a photosensitive material layer on the insulation material layer.

Step S206: Perform an exposure process on the photosensitive material layer by using a photomask.

Step S207: Perform a development process on the photosensitive material layer, to form a photoresist layer having a plurality of thicknesses, where a thickness of the photoresist layer above the middle part of the gate pattern is greater than a thicknesses of the photoresist layer above the two sides of the gate pattern.

Step S208: Remove a part of the semiconductor layer, to form a semiconductor pattern.

Step S209: Perform a dry etching process on the photoresist layer, to remove the thicknesses of the photoresist layer above the two sides of the gate pattern and leave the part of the first photoresist layer above the middle part of the gate pattern to cover a part of the semiconductor pattern.

Step S210: Change the part of the semiconductor pattern uncovered by the photoresist layer into a conductor layer by means of a conductor process.

Step S211: Remove the entire photoresist layer above the gate pattern.

Step S212: Form a second metal layer on the semiconductor pattern, the conductor layer and the gate insulation layer, and pattern the second metal layer, to form a source and a drain.

Step S213: Form a passivation layer on the source, the drain, the semiconductor pattern, and the gate insulation layer.

Due to the improvement in this application, in a BCE-structured active array switch 1 with a semiconductor, there is no overlapping area between a gate and a source/between a gate and a drain. During a process, a semiconductor pattern 13' is changed into a conductor layer by means of a conductor process, to reduce impedance between a source/drain and a TFT channel. In this way, parasitic capacitance in the active array switch is greatly reduced while on-current is ensured.

The wordings such as "in some embodiments" and "in various embodiments" are repeatedly used. The wordings usually refer to different embodiments, but they may also refer to a same embodiment. The terms such as "comprising", "having" and "including" are synonyms, unless other meanings are indicated in the context.

The foregoing descriptions are merely embodiments of this application, and are not intended to limit this application in any form. Although this application has been disclosed above through the specific embodiments, the embodiments are not intended to limit this application. Any person skilled in the art can make some variations or modifications, which are equivalent changes, according to the foregoing disclosed technical content to obtain equivalent embodiments without departing from the scope of the technical solutions of this application. Any simple amendment, equivalent change, or modification made to the foregoing embodiments according to the technical essence of this application without departing from the content of the technical solutions of this application shall fall within the scope of the technical solutions of this application.

What is claimed is:

1. A method for manufacturing an active array switch, comprising the following steps:
   forming a first metal layer on a substrate, and patterning the first metal layer, to form a gate pattern;
   forming a gate insulation layer on the substrate, to cover the gate pattern;
   forming a semiconductor layer on the gate insulation layer,
   forming a photoresist layer having a plurality of thicknesses on the semiconductor layer, wherein a thickness of the photoresist layer above the middle part of the gate pattern is greater than a thickness of the photoresist layer above the two sides of the gate pattern;
   removing a part of the semiconductor layer, to form a semiconductor pattern;
   performing a dry etching process on the photoresist layer, to remove the thicknesses of the photoresist layer above the two sides of the gate pattern and leave the part of the first photoresist layer above the middle part of the gate pattern to cover a part of the semiconductor pattern;
   changing the part of the semiconductor pattern uncovered by the photoresist layer into a conductor layer by means of a conductor process;
   removing the entire photoresist layer above the gate pattern; and
   forming a second metal layer on the semiconductor pattern, the conductor layer and the gate insulation layer, and patterning the second metal layer, to form a source and a drain.

2. The method for manufacturing an active array switch according to claim 1, wherein the step of forming the photoresist layer having a plurality of thicknesses comprises forming a photosensitive material layer on the semiconductor layer.

3. The method for manufacturing an active array switch according to claim 2, comprising: performing an exposure process on the photosensitive material layer by using a half-tone photomask, and performing a development process.

4. The method for manufacturing an active array switch according to claim 2, comprising: performing an exposure process on the photosensitive material layer by using a gray-tone photomask, and performing a development process.

5. The method for manufacturing an active array switch according to claim 1, wherein the semiconductor layer is a metal oxide semiconductor layer.

6. The method for manufacturing an active array switch according to claim 5, wherein metal of the metal oxide semiconductor layer comprises elements from group II to group VI and groups comprising compounds of these elements.

7. The method for manufacturing an active array switch according to claim 6, wherein the metal oxide semiconductor layer is further doped with an alkaline-earth metal element.

8. The method for manufacturing an active array switch according to claim 6, wherein the metal oxide semiconductor layer is further doped with a group IIIA element.

9. The method for manufacturing an active array switch according to claim 6, wherein the metal oxide semiconductor layer is further doped with a group VA element.

10. The method for manufacturing an active array switch according to claim 6, wherein the metal oxide semiconductor layer is further doped with a group VIA element.

11. The method for manufacturing an active array switch according to claim 6, wherein the metal oxide semiconductor layer is further doped with one element selected from a group comprising transition metal.

12. The method for manufacturing an active array switch according to claim 6, wherein the metal oxide semiconductor layer is further doped with a plurality of elements selected from a group comprising transition metal.

13. The method for manufacturing an active array switch according to claim 1, wherein a passivation layer is formed on the source, the drain, the semiconductor pattern, and the gate insulation layer.

14. The method for manufacturing an active array switch according to claim 1, wherein an insulation material layer is formed between the semiconductor layer and the photoresist layer.

15. The method for manufacturing an active array switch according to claim 14, wherein the insulation material layer is an organic insulation material layer.

16. The method for manufacturing an active array switch according to claim 15, wherein the inorganic insulation material layer is made of silicon oxide or silicon nitride.

17. The method for manufacturing an active array switch according to claim 14, wherein the insulation material layer is an inorganic insulation material layer.

18. The method for manufacturing an active array switch according to claim 17, wherein the inorganic insulation material layer is made of polymethyl methacrylate.

19. The method for manufacturing an active array switch according to claim 17, wherein the inorganic insulation material layer is made of polyvinyl phenol.

20. A method for manufacturing an active array switch, comprising the following steps:
    forming a first metal layer on a substrate, and patterning the first metal layer, to form a gate pattern;
    forming a gate insulation layer on the substrate, to cover the gate pattern;
    forming a semiconductor layer on the gate insulation layer;
    forming an insulation material layer on the semiconductor layer;
    forming a photosensitive material layer on the insulation material layer;
    performing an exposure process on the photosensitive material layer by using a photomask;
    performing a development process on the photosensitive material layer, to form a photoresist layer having a plurality of thicknesses, wherein a thickness of the photoresist layer above the middle part of the gate pattern is greater than a thickness of the photoresist layer above the two sides of the gate pattern;
    removing a part of the semiconductor layer, to form a semiconductor pattern;
    performing a dry etching process on the photoresist layer, to remove the thicknesses of the photoresist layer above the two sides of the gate pattern and leave the part of the first photoresist layer above the middle part of the gate pattern to cover a part of the semiconductor pattern;
    changing the part of the semiconductor pattern uncovered by the photoresist layer into a conductor layer by means of a conductor process;
    removing the entire photoresist layer above the gate pattern;
    forming a second metal layer on the semiconductor pattern, the conductor layer and the gate insulation layer, and patterning the second metal layer, to form a source and a drain; and
    forming a passivation layer on the source, the drain, the semiconductor pattern, and the gate insulation layer.

* * * * *